United States Patent [19]

Ecklund

[11] Patent Number: 4,680,795
[45] Date of Patent: Jul. 14, 1987

[54] DUAL PURPOSE VARIABLE Q FILTER

[75] Inventor: Lawrence M. Ecklund, Wheaton, Ill.

[73] Assignee: Motorola, Inc., Schaumburg, Ill.

[21] Appl. No.: 812,687

[22] Filed: Dec. 23, 1985

[51] Int. Cl.$^4$ .............................................. H04H 5/00
[52] U.S. Cl. ........................................ 381/15; 381/98
[58] Field of Search ................ 381/15, 16, 13, 1, 98, 381/3, 4

[56] References Cited

U.S. PATENT DOCUMENTS

| 4,206,317 | 6/1980 | Kahn | 381/15 |
| 4,388,494 | 6/1983 | Schone et al. | 381/1 |
| 4,430,747 | 2/1984 | Streeter | 381/15 |
| 4,486,898 | 12/1984 | Yokoya | 381/15 |
| 4,504,966 | 3/1985 | Hershberger | 381/15 |
| 4,574,389 | 3/1986 | Schotz | 381/13 |

Primary Examiner—Forester W. Isen
Attorney, Agent, or Firm—Margaret Marsh Parker

[57] ABSTRACT

A variable Q filter network in an AM stereophonic receiver provides elimination of any adjacent channel carrier interference while providing the function of a tone control, either automatic or manually controlled. Parts count and costs, IC pinouts and the possibility of intermodulation are all reduced.

19 Claims, 6 Drawing Figures

DUAL PURPOSE VARIABLE Q FILTER

BACKGROUND OF THE INVENTION

This invention relates to the field of filters and, more particularly, to a dual purpose variable Q filter for use in AM stereophonic receivers.

In an AM stereophonic receiver such as could utilize the present invention, it has been known to include a notch filter to eliminate an interfering signal due to an adjacent channel carrier signal from appearing as a tone in the audio outputs. Since the AM band in the United States provides for 10 kHz channel spacing, this signal will be a 10 kHz tone. Naturally, with different channel spacing, the tone frequency will be different. Even though such a signal may be a low level tone, it is a relatively constant tone and any program signal components at such frequencies are usually very low level signals. Notch filters in the prior art, when accurately tuned, can reduce this "whistle" satisfactorily, but they have such a very narrow-bottomed characteristic that only a slight mistuning will greatly reduce the whistle rejection. Thus the receiver designer has a choice of using low cost components and risking reduced rejection at 10 kHz, or of using more accurate but more expensive components.

Also in such receivers it is known to provide for tone control by putting a user-controlled lowpass filter in each of the left and right channels. When the receiver or decoder is designed to be completely or substantially contained on an integrated circuit chip, an excessive number of pads and pins may be required for four such filters. The capability of user control of the higher audio frequencies is usually provided by a variable resistance in each of the two channels. In an integrated circuit embodiment of the receiver, this often required two output pins just for the tone control function. The cost of four filters plus the potentiometers can be a substantial portion of the cost of a receiver.

In AM monophonic or stereophonic reception, it may be desirable to eliminate the 10 kHz difference signal before the decoding process, thereby eliminating any distortion caused by the 10 kHz in the envelope detector or the stereo decoder.

SUMMARY OF THE INVENTION

It is therefore an object of this invention to provide a single means for eliminating any 10 kHz tone caused by adjacent channel interference and for supplying satisfactory tone control capability.

It is another object to provide these functions with fewer components and/or with fewer terminals required.

These objects and others which will become apparent are provided in an AM stereophonic receiver which includes variable Q notch filters inserted in either the left and right channels or in the in-phase and quadrature channels of the receiver. Changing the Q of the filter will change the shape of the curve, thus providing the desired control of the frequency response or "tone" and, more importantly, will improve 10 kHz rejection. At any setting of the filter, the notch will reduce the 10 kHz tone or "whistle" caused by an adjacent channel carrier, but the widening of the notch improves the rejection capability even if the component values drift, and can reduce or prevent intermodulation distortion.

DETAILED DESCRIPTION OF A PREFERRED EMBODIMENT

Figure 1:
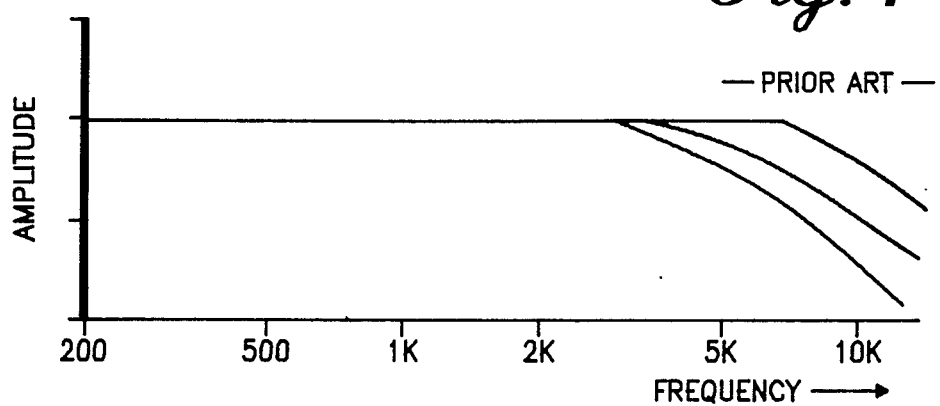
FIG. 1 shows frequency response curves of a tone control of the prior art.

The frequency response curves of FIG. 1 represent three of the possible settings of a tone control as used in the prior art. Such controls are well known and provide some measure of listener choice in the amount of high frequency information present in the audio output of a piece of audio equipment such as a radio receiver. The curves in this example show fall-offs at three different frequencies but it will be apparent that an essentially infinite number of settings is possible. A variety of shapes of response curve is also possible, but the one shown is representative.

Figure 2:
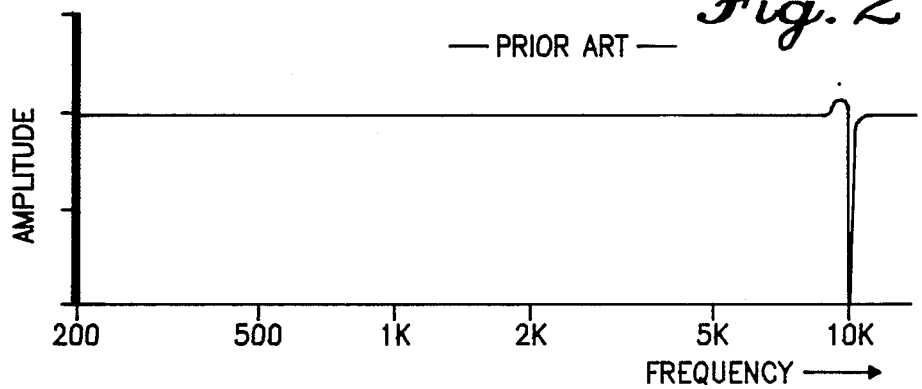
FIG. 2 is a frequency response curve of a notch filter of the prior art.

FIG. 2 is the frequency response curve of a typical high Q notch filter or band rejection filter as it may be termed. Such a filter is usually used when it is known that an undesired tone of a fixed frequency is present or likely to be present within the frequency range of the desired signals, and typically has a very narrow, "infinite" rejection band in order to avoid unnecessary rejection of desired signals. The shape of the corners depends on the number of poles in the filter network. It can be seen that, if this filter is mistuned by even a small amount, the rejection of the desired center frequency may be reduced by a substantial amount. Due to the relatively high cost of accurate components, mistuning is more the rule than the exception in practice.

Figure 3:
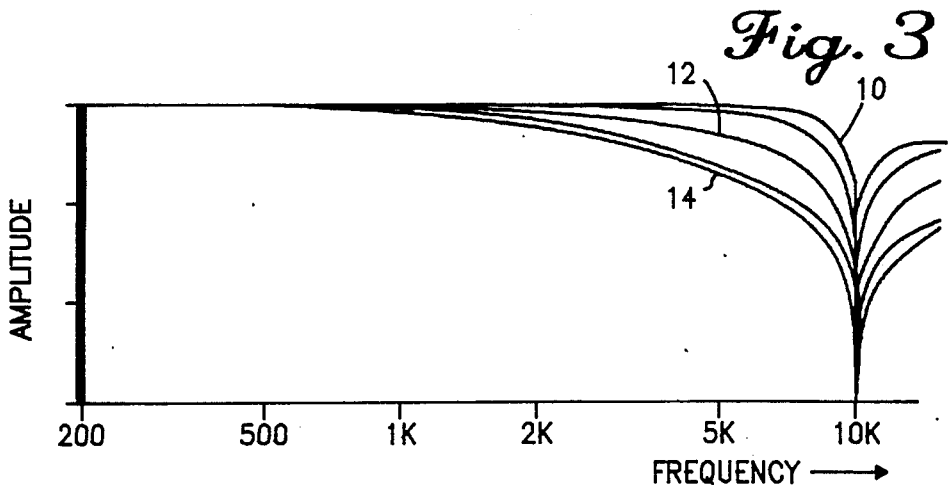
FIG. 3 shows frequency response curves of the filter of the present invention.

FIG. 3 shows a number of possible response curves of the dual purpose variable filter of the invention. It may be seen that the curve 10 is similar to but slightly broader than the curve of FIG. 2, providing strong rejection for the 10 kHz whistle, and cut-off for the tone control at a frequency relatively near the notch center frequency. Curve 12 shows a somewhat flattened out response curve, still providing strong rejection at or near 10 kHz, but having a lower and more gradual cutoff of the frequencies above and below that frequency. Curve 14 again displays strong rejection at 10 kHz, but a much lower and very gradual cut-off. Again, the scale and the actual frequencies shown on the curves 10–14 are exemplary only. It is clear that, if the filter components were slightly off value or drift during use, there will still be sufficient rejection at 10 kHz. Naturally this allows the use of less expensive components. The choice of center frequency of the notch will, in this application, be determined by the channel spacing which is 10 kHz in the United States. It will be seen that the curves of FIG. 3 provide the same function as the combination of the curves of FIGS. 1 and 2 with certain advantages and with fewer components, as will be further explained.

Figure 4:
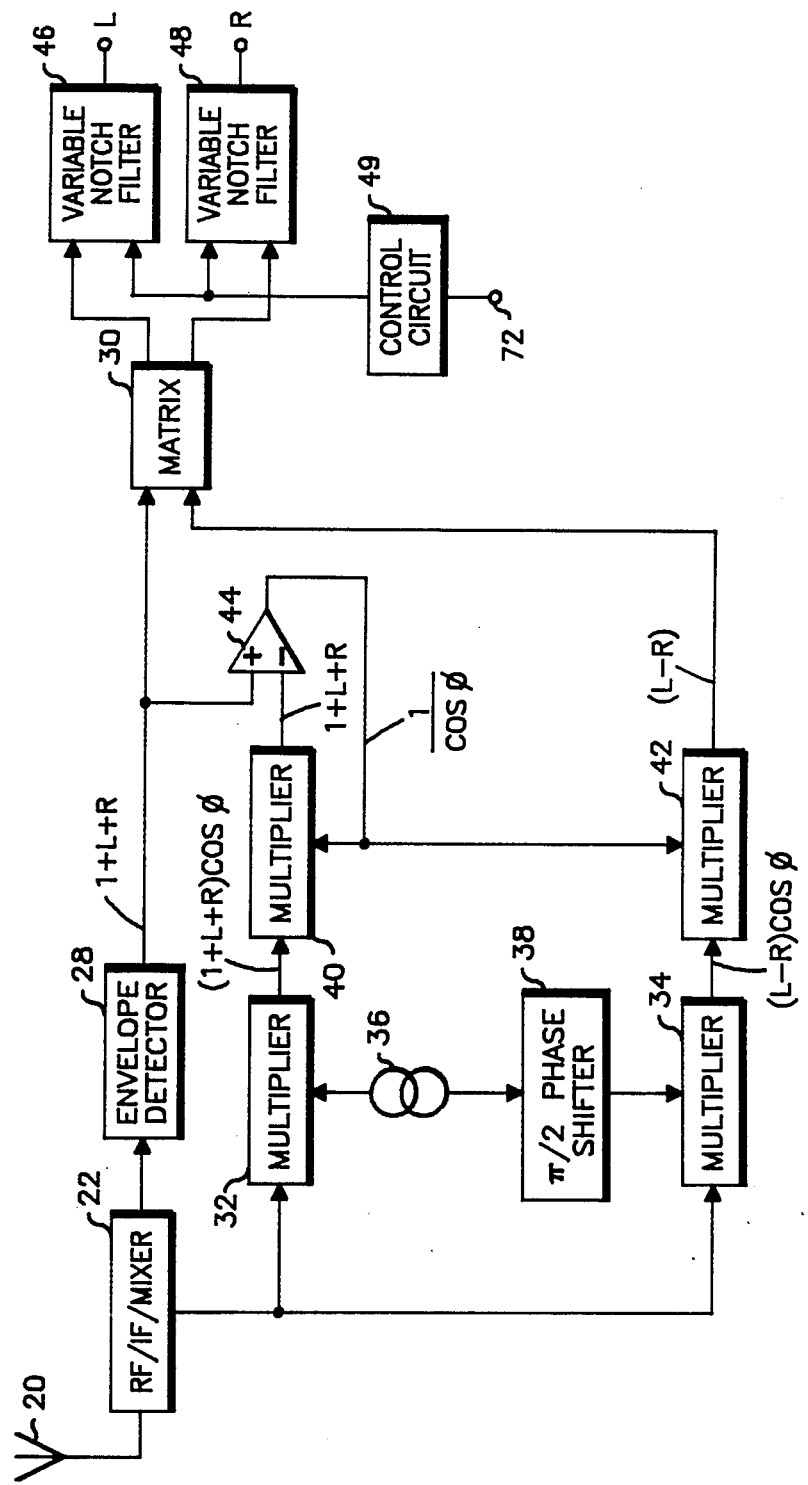
FIG. 4 is a block diagram of a receiver using an embodiment of the invention.

FIG. 4 is a block diagram of an AM stereophonic receiver such as was disclosed in U.S. Pat. No.

4,371,747, assigned to the assignee of the present invention. At an antenna 20, a stereo signal is received which is of the form $(1+L+R) \cos(w_c t + \phi)$ where L and R are program signals and $\phi$ is arc tan $[(L-R)/(1+L+R)]$. The received signal is detected and mixed with a local oscillator frequency in an RF/IF/mixer stage 22. The resulting IF signal is coupled to an envelope detector 28 where the envelope signal $1+L+R$ is detected and coupled to a matrix 30. Two synchronous detectors or multipliers 32,34 also receive the IF signal and multiply that signal by a signal from a local oscillator 36 and a phase-shifted oscillator signal from a $\bar{n}/2$ phase shifter 38, providing output signals of $(1+L+R)\cos\phi$ and $(L-R)\cos\phi$, respectively. These two output signals are then coupled to two additional multipliers 40,42 where they are corrected by a signal $1/\cos\phi$. The correction signal comes from a comparator 44 wherein the detected envelope signal from the envelope detector 28 is compared with the output signal of the multiplier 40. The output of the comparator is thus the signal which is required to make the multiplier 40 output equal the envelope. This signal, of course, is also the signal required to correct the output of the multiplier 42. The corrected output $(L-R)$ of the multiplier 42 is also coupled to the matrix 30, thus the matrixed output signals are essentially the left and right program signals L and R.

Figure 6:
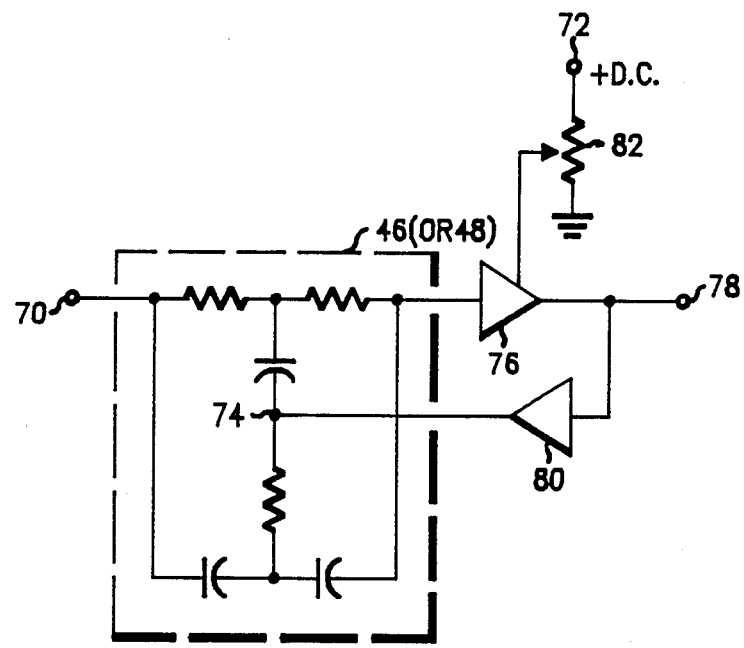
FIG. 6 is a schematic diagram of an embodiment of the filter of the invention.

The program signals from the matrix 30 are quite satisfactory for being coupled to audio amplifiers and loudspeakers (not shown) as long as there is no significant amount of adjacent channel carrier interference causing an interfering 10 kHz signal. Since the standard AM broadcast band is a heavily populated band, the likelihood of there being an interfering adjacent channel signal is not insignificant. Therefore, it is desirable to insert 10 kHz notch filters 46,48 in each of the L and R output lines. Since it is also desirable to provide for tone control, typically user operated, the notch filters 46,48 are designed to have a variable Q and to provide, at the user's discretion, the function of tone control together with the elimination of the 10 kHz interference in accordance with the curves of FIG. 3. The change in the Q of the filters 46,48 can be accomplished by a signal from a control circuit 49. The control circuit 49 can be implemented in several ways, the most likely one using a D.C. signal from a single user-controlled potentiometer as seen in FIG. 6. The control signal may also be derived from an AGC circuit (not shown) or a "blend circuit" (not shown) if it is desired to control the level of the higher audio frequencies automatically. The control signal may also be derived in response to the amount of 10 kHz present in the received signal, if desired.

Figure 5:
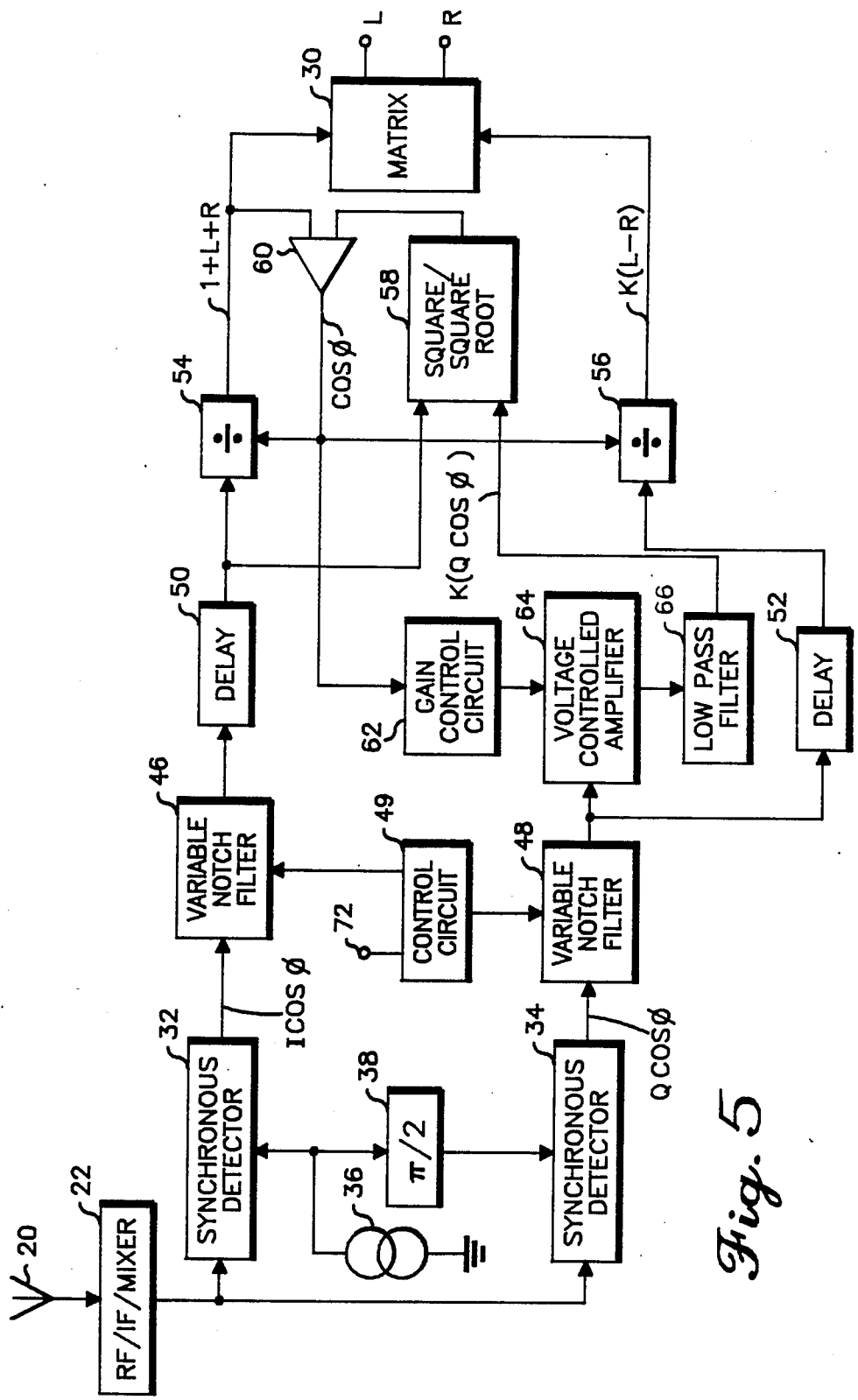
FIG. 5 is a block diagram of another receiver using an embodiment of the invention.

FIG. 5 is a block diagram of another type of AM stereophonic receiver for use with the same signal as in the receiver of FIG. 4. This receiver is substantially the receiver disclosed in a copending application, Ser. No. 761,730. In this receiver, there is again the antenna 20 coupled to the RF/IF/mixer stages 22. The local oscillator 36 and phase shifter 38 again couple a pair of quadrature carrier frequency signals to the multipliers or synchronous detectors 32,34, respectively. As before, the detector output signals are $(1+L+R) \cos \phi$ and $(L-R) \cos \phi$, or $I \cos \phi$ and $Q \cos \phi$. Ignoring the variable notch filters 46,48 for the moment, the detector output signals are coupled through delay circuits 50,52, as may be required, to a pair of divider circuits 54,56 where each signal is divided by a correction signal cos $\phi$. The corrected divider circuit output signals $1+L+R$ and $L-R$ are then coupled to the matrix 30. In this receiver, the correction signal is derived in a different fashion from that shown in FIG. 4. The signal from the delay circuit 50 and the signal originating in the synchronous detector 34 are coupled to a square/square root circuit 58. In the circuit 58, each input signal is separately squared, the two squared signals are summed, and the square root of the resulting sum signal is taken. This output signal can be shown to be essentially the envelope signal, therefore, when the signal is compared in a comparator 60 to the output of the divider 54, the comparator output signal is that correction signal needed to correct the outputs of the synchronous detectors 32,34. In the particular receiver shown, the correction signal is also coupled to a gain control circuit 62 where it is used to control a voltage controlled amplifier 64. The input signal of the amplifier 64 comes from the synchronous detector 34 and the output of the amplifier is attenuated in response to an excessively large correction signal. "K" represents the gain of the amplifier and equals 1 or less than 1. A low pass filter 66 may be used in the connection between the voltage controlled amplifier 64 and the square/square root circuit 58 as desired.

Returning now to the output signals of the synchronous detectors 32,34, the variable notch filters 46,48 eliminate any 10 kHz signals which may be present. This circuit position is the preferred one. As stated previously, since normal program signals are unlikely to contain significant levels of signal at such frequencies, any 10 kHz signals which are present are usually caused by adjacent channel interference. Elimination of any 10 kHz "whistle" at this point in the decoding process not only prevents that annoyance, but also prevents the subsequent production of distortion components in the following stages. At the same time, the capability of varying the Q of the filters 46,48 provides for user control of the high frequency content of the audio output of the receiver but, as in FIG. 4, the Q control signal may be derived from any desired source, manually operated or automatic.

The schematic diagram of FIG. 6 is of a preferred embodiment of one of the filters 46,48 with control circuit 49, such as could be used in the receivers of either FIG. 4 or 5. Input terminal 70 could be an output of the matrix 30, as in FIG. 4, or the output of one of the synchronous detectors 32 or 34, as in FIG. 5. A terminal 72 provides a D.C. voltage which is varied to provide the control signal. The components within the dashed line comprise a twin "T" network. It is known that the Q of such a filter network can be raised by coupling back a portion of the filter output to a terminal point 74 which would otherwise be coupled to ground. The amount of feedback would normally be controlled via the tap on a potentiometer coupled back from the output. In this embodiment, the filter network output is coupled through a 4-quadrant multiplier circuit 76 the integrated circuit MC1495, manufatured by Motorola, Inc. to an output terminal 78, and back through a buffer stage 80. The two circuits 76 for both notch filters can be controlled by means of a single variable resistance 82, saving the cost of one potentiometer. Since the feedback is coupled through a circuit with a very low impedance output, the depth of the notch and the center frequency will remain the same as the Q changes. In this embodiment, the feedback can be continuously varied from positive to negative values and the Q can be raised from a value less than 1 to as much as 50. The curve 14 of FIG. 3 is an example of tone control using a negative value of feedback. The D.C. which is applied to the circuit 76 could be from other circuit sources such as an AGC circuit or a blend circuit (neither shown here).

Thus there has been shown and described a means of reducing the number and cost of components in an AM stereo receiver by the use of 10 kHz notch filters with variable Q for eliminating any 10 kHz whistle due to adjacent channel interference and for controlling the Q to provide a wide range of tone control function as required by the user or by automatic means. Reduced intermodulation distortion is also provided by the invention.

I claim:

1. A dual purpose variable Q notch filter arrangement as for use in an AM sterophonic radio receiver and comprising:
    first and second input means for providing respective first and second input signals related to a received sterophonic signal;
    first and second notch fitler network means coupled to receive said respective input signals for rejecting a predetermined, narrow band of frequencies having a fixed center frequency;
    first and second feedback circuits responsive to the respective outputs of said first and second notch filter network means coupled to supply signals for affecting the Q of said respective network means without affecting said center frequency;
    control means coupled to control the signals supplied by each said first and second feedback circuit for providing a tone control function for said receiver, whereby the frequency response of the filter arrangement below said band of frequencies is variable.

2. A dual purpose variable Q filter arrangement in accordance with claim 1 further including a receiver comprising first and second synchronous detectors and the input means comprises the outputs of said synchronous detectors.

3. A dual purpose variable Q filter arrangement in accordance with claim 1 further including a receiver comprising matrixing means and the input means comprises the outputs of said matrixing means.

4. A dual purpose variable Q filter arrangement in accordance with claim 1 wherein each said filter network comprises a twin "T" network.

5. A dual purpose variable Q filter arrangement in accordance with claim 1 wherein said predetermined band of frequencies is centered on an interference frequency.

6. A dual purpose variable Q filter arrangement in accordance with claim 1 wherein said control means includes means for manual operation.

7. A dual purpose variable Q filter arrangement in accordance with claim 1 wherein said control means includes means for automatic operation which comprises a receiver.

8. A dual purpose variable Q filter arrangement in accordance with claim 7, wherein said receiver includes an AGC circuit and said means for automatic operation comprises a connection to said AGC circuit.

9. A dual purpose variable Q filter arrangement in accordance with claim 7 wherein said receiver includes a stereo blend circuit and said means for automatic operation comprises a connection to said blend circuit.

10. A dual purpose variable Q filter arrangement in accordance with claim 7 wherein said receiver includes means for measuring the amount of interfering signals, and said means for automatic operation comprises a connection to said measuring means.

11. A dual purpose variable Q filter arrangement in accordance with claim 7 wherein said first and second feedback circuits provide both negative and positive feedback.

12. An AM stereophonic receiver for receiving a compatible AM signal and comprising:
    first ciriucit means for selectively receiving said compatible signal;
    demodulating means coupled to the first circuit means for providing first and second signals related to the sum and difference of the modulating signals of said received signal;
    first and second filter network means coupled to receive said first and second signals respectively for rejecting a predetermined narrow band of frequencies in each signal having a fixed center frequency;
    first and second feedback circuits responsive to the respective outputs of said first and second filter network means coupled to supply signals for affecting the Q of said respective network means;
    control means coupled to control the signals supplied by each said feedback circuit; and
    matrixing means coupled for priviiding first and second output signals related to said modulating signals.

13. An AM stereophonic receiver in accordance with claim 12 and wherein the demodulating means includes first and second synchoronous detectors.

14. An AM stereophonic receiver in accordance with claim 13 and wherein said filter networks are coupled to the detector outputs of the demodulating means.

15. An AM stereophonic receiver in accordance with claim 12 and further including correction means coupled to the filter networks for use in providing said output signals and the matrixing means is coupled to receive the corrected signals.

16. An AM stereophonic receiver in accordance with claim 12 and wherein the demodulating means includes an envelope detector and at least one synchoronous detector.

17. An AM stereophonic receiver in accordance with claim 16 and further including correction means coupled to the detectors for use in providing said output signals and the matrixing means is coupled to receive the corrected signals.

18. An AM stereophonic receiver for receiving a compatible AM signal and comprising:
    first circuit means for selectively receiving said compatible signal;
    demodulating means coupled to the first circuit means for providing first and second signals related to the sum and difference of the modulating signals of said received signal;
    matrixing means coupled to the demodulating means for providing third and fourth signals related to the said modulating frequencies;
    first and second filter network means coupled to said matrixing means for receiving said third and fourth signals respectively for rejecting a predetermined narrow band of frequencies in each signal having a fixed center frequency;

first and second feedback circuits responsive to the respective outputs of said first and second filter network means coupled to supply signals for affecting the Q of said respective network means; and control means coupled to control the signals supplied by each said feedback circuit.

19. An AM stereophonic receiver in accordance with claim 18 and further including correction means coupled to the detectors for use in providing said output signals.

* * * * *

UNITED STATES PATENT AND TRADEMARK OFFICE
CERTIFICATE OF CORRECTION

PATENT NO. : 4,680,795

DATED : July 14, 1987

INVENTOR(S) : Lawrence M. Ecklund

It is certified that error appears in the above-identified patent and that said Letters Patent is hereby corrected as shown below:

Column 5, line 22, please correct the spelling of the word "fitler" to --filter--.

Column 6, line 12, please correct the spelling of the word "ciricuit" to --circuit--.

Column 6, line 30, please correct the spelling of the word "prividing" to --providing--.

Signed and Sealed this

Tenth Day of November, 1987

Attest:

DONALD J. QUIGG

Attesting Officer

Commissioner of Patents and Trademarks